United States Patent
Heo

(10) Patent No.: US 10,132,857 B2
(45) Date of Patent: Nov. 20, 2018

(54) APPARATUS FOR TOUCH SENSOR TEST

(71) Applicant: Dongbu HiTek Co., Ltd., Gyeonggi-do (KR)

(72) Inventor: Woon Hyung Heo, Chungcheongnam-do (KR)

(73) Assignee: DB HITEK CO., LTD., Seoul (KR)

( * ) Notice: Subject to any disclaimer, the term of this patent is extended or adjusted under 35 U.S.C. 154(b) by 292 days.

(21) Appl. No.: 15/075,906

(22) Filed: Mar. 21, 2016

(65) Prior Publication Data

US 2017/0045574 A1    Feb. 16, 2017

(30) Foreign Application Priority Data

Aug. 12, 2015    (KR) .................. 10-2015-0113957

(51) Int. Cl.
| | | |
|---|---|---|
| G01R 31/28 | (2006.01) | |
| G06F 3/041 | (2006.01) | |
| G06F 3/044 | (2006.01) | |
| G06F 3/045 | (2006.01) | |
| G09G 3/36 | (2006.01) | |

(52) U.S. Cl.
CPC ......... *G01R 31/2829* (2013.01); *G06F 3/044* (2013.01); *G06F 3/0418* (2013.01)

(58) Field of Classification Search
CPC ..... G06F 3/041; G06F 3/0416–3/0418; G09G 3/3648
See application file for complete search history.

(56) References Cited

U.S. PATENT DOCUMENTS

| | | | | |
|---|---|---|---|---|
| 9,244,568 | B2* | 1/2016 | Philipp | G06F 3/044 |
| 2009/0027095 | A1* | 1/2009 | Matsui | H03K 5/1252 |
| | | | | 327/165 |
| 2009/0322700 | A1* | 12/2009 | D'Souza | G06F 3/045 |
| | | | | 345/174 |
| 2011/0115717 | A1* | 5/2011 | Hable | G06F 3/0416 |
| | | | | 345/173 |
| 2012/0293336 | A1* | 11/2012 | Pereverzev | G06F 3/0418 |
| | | | | 340/635 |
| 2013/0320994 | A1* | 12/2013 | Brittain | G06F 3/0416 |
| | | | | 324/537 |
| 2014/0218334 | A1* | 8/2014 | Shibata | G06F 3/044 |
| | | | | 345/174 |
| 2014/0327648 | A1* | 11/2014 | Von Hase | G06F 3/0414 |
| | | | | 345/174 |
| 2015/0097805 | A1* | 4/2015 | Mine | G06F 3/044 |
| | | | | 345/174 |
| 2016/0012760 | A1* | 1/2016 | Tanaka | G09G 3/3648 |
| | | | | 345/101 |
| 2016/0080841 | A1* | 3/2016 | Bergstrom | H04Q 9/00 |
| | | | | 340/870.07 |
| 2016/0320911 | A1* | 11/2016 | Crandall | G06F 3/0418 |
| 2016/0364050 | A1* | 12/2016 | Shibata | G06F 3/0416 |
| 2017/0205912 | A1* | 7/2017 | Li | G06F 3/0412 |

FOREIGN PATENT DOCUMENTS

WO    WO 2013/133554    *    9/2013    .............    G06F 3/044

* cited by examiner

*Primary Examiner* — Lin Li
(74) *Attorney, Agent, or Firm* — Patterson Thuente Pedersen, P.A.

(57) ABSTRACT

An apparatus can include a test power supplier comprising a power supply to sense resistance between electrodes of a touch sensor, and a comparison unit configured to compare the sensed resistance between the electrodes with an allowable threshold to output a comparison result.

9 Claims, 4 Drawing Sheets

APPARATUS FOR TOUCH SENSOR TEST

CROSS-REFERENCE TO RELATED APPLICATION

This application claims the benefit of priority to Korean Patent Application No. 10-2015-0113957, filed on Aug. 12, 2015 with the Korean Intellectual Property Office, the disclosure of which is hereby incorporated by reference as if fully set forth herein.

BACKGROUND OF THE INVENTION

Field of the Invention

The present disclosure relates to an apparatus for touch sensor test, and more particularly, to an apparatus capable of checking whether there is short between electrodes of touch sensor, regardless of an amount of capacitance, fast and simply.

Discussion of the Related Art

A touch sensor is an input device capable of sensing a physical contact from user's finger or other objects and changing the physical contacts with a corresponding electric signal, in order to recognize coordinates (the location of a point in space) or user's gesture. The touch sensor is widely applicable to electric devices or systems. Particularly, when the touch sensor is associated for a display device, the touch sensor may be substituted with an additional input device such as a keypad which occupies some space in an electric device or system. Accordingly, the touch sensor can be used in a mobile phone, a smart phone, a personal digital assistant (PDA), a tablet personal computer, and the like.

According to a method for sensing touch or contact, the touch sensor types may include a 5-wire (or 4-wire) resistive, surface capacitive, projected capacitive, surface acoustic wave and Infrared sensors. Among those, the surface capacitive sensors are activated with the touch of object, e.g., human finger/skin or a stylus, holding an electrical charge. When exposed finger touches the monitor screen, a transparent electrode film placed on top of the glass panel reacts to the static electrical capacity of the object. The change in capacitance is detected by sensors located at the four corners of the screen. The monitor screen including the surface capacitive sensors may have advantages of durability, high scratch resistance, high integration (thin screen), multi-touch support, and so on.

Two electrodes of the touch sensor are separate from each other via an insulator electrically. However, the two electrodes may be shorted with some resistance, not electrically separate, because of some reasons such as incomplete etching on manufacturing process. These defects can be detected by a test circuit including a current source. The test circuit detects an amount of current and a corresponding resistance incurred to determine whether two electrodes are electrically shorted when the current is supplied into each touch sensor.

In the test circuit, the amount of current supplied from the current source is increased until a predetermined value is outputted. Then, the amount of supplied current can be used to determine whether there is electric short between two electrodes of the touch sensor. However, the amount of supplied current from the test circuit can be changed because of resistance between the two electrodes as well as capacitance of the two electrodes. Not every touch sensor has the same capacitance. Accordingly, the test circuit may easily detect resistance between two electrodes, which is closer to 0Ω (for example, two electrodes are electrically short and resistance is minimized). However, it is hard for the test circuit to determine whether the touch sensor is defective when its resistance between any two electrodes is a few-hundreds kΩ to a few MΩ.

SUMMARY OF THE INVENTION

The present disclosure is directed to a touch sensor that substantially obviates one or more problems due to limitations and disadvantages of the related art.

The present disclosure supports a device for detecting defectiveness of touch sensor.

Further, the present disclosure supports a device for checking whether electrodes of touch sensor are electrically shorted with substandard resistance, regardless of parasitic capacitance or capacitance between the electrodes.

Further, the present disclosure supports a test circuit for providing a voltage/current having an adjustable level/amount according to a defect range which is determined based on performance requirement or circumstance of a touch sensor, in order to enhance test efficiency.

Additional advantages, objects, and features will be set forth in part in the description which follows and in part will become apparent to those having ordinary skill in the art upon examination of the following or may be learned from practice of the disclosed methods.

To achieve these objects and other advantages as embodied and broadly described herein, an apparatus for testing a touch sensor can include a test power supplier comprising an allowable threshold about resistance between electrodes of touch sensor; and a comparison unit configured to compare sensed resistance between the electrodes with the allowable threshold to output a comparison result.

The test power supplier can include an adjustable resistance having a resistance changed in response to the allowable threshold; and a buffer for buffering a power supplied into the adjustable resistance.

If the resistance of the adjustable resistance is substantially equal to the allowable threshold, a reference voltage supplied into the comparison unit can have a half level of a first voltage supplied into the adjustable resistance.

The adjustable resistance can have 5MΩ or less resistance and the comparison unit can be capable of outputting the comparison result when the sensed resistance between the electrodes is equal to or less than 5MΩ.

The adjustable resistance can have 1MΩ or less resistance and the comparison unit can be capable of outputting the comparison result when the sensed resistance between the electrodes is equal to or less than 1MΩ.

The test power supplier can include a power source for providing an amount of current corresponding to the allowable threshold.

Further, the apparatus can include a switching device configured to selectively couple the touch sensor to the test power supplier and the comparison unit.

The comparison unit can announce that the touch sensor is defective when the sensed resistance between the electrodes is less than the allowable threshold, while informing that the touch sensor is faultless when the sensed resistance between the electrodes is equal to or larger than the allowable threshold.

If the resistance of adjustable resistance is n times as large as the allowable threshold, a reference voltage supplied into the comparison unit is 1/(n+1) times as large as a first voltage supplied into the adjustable resistance, where n is an integer.

If the resistance of adjustable resistance is 1/n times as large as the allowable threshold, a reference voltage supplied into the comparison unit can be n/(n+1) times as large as a first voltage supplied into the adjustable resistance, where n is an integer.

In another aspect of the present disclosure, a touch screen apparatus can include a display panel comprising plural touch sensors arranged in a matrix, and a test circuit selectively coupled to the plural touch sensors. Herein, the test circuit can include a test power supplier comprising an allowable threshold about resistance between electrodes of each touch sensor, and a comparison unit configured to compare sensed resistance between the electrodes with the allowable threshold to output a comparison result.

The test power supplier can include an adjustable resistance having a resistance changed in response to the allowable threshold, and a buffer for buffering a power supplied into the adjustable resistance.

If the resistance of the adjustable resistance can be substantially equal to the allowable threshold, a reference voltage supplied into the comparison unit has a half level of a first voltage supplied into the adjustable resistance.

The comparison unit can determine that the touch sensor is defective when the sensed resistance between the electrodes is less than the allowable threshold, while informing that the touch sensor is faultless when the sensed resistance between the electrodes is equal to or larger than the allowable threshold.

When the resistance of adjustable resistance is n times as large as the allowable threshold, a reference voltage supplied into the comparison unit can be 1/(n+1) times as large as a first voltage supplied into the adjustable resistance (n is an integer).

When the resistance of adjustable resistance is 1/n times as large as the allowable threshold, a reference voltage supplied into the comparison unit can be n/(n+1) times as large as a first voltage supplied into the adjustable resistance (n is an integer).

In another aspect of the present disclosure, a method for checking a touch sensor can include adjusting resistance of adjustable resistance in response to an allowable threshold about resistance between two electrodes of touch sensor; providing a first voltage through the adjustable resistance coupled to one of the two electrodes; recognizing a test voltage between the two electrodes; and comparing the test voltage with a second voltage to output a comparison result. Herein, in embodiments, the test voltage is determined based on an adjustable resistance, the resistance between the two electrodes and the first voltage, while the second voltage is corresponding to a resistance of the adjustable resistance, the allowable threshold and the first voltage.

If the resistance of adjustable resistance is n times as large as the allowable threshold, the second voltage can be 1/(n+1) times as large as the first voltage (n is an integer).

If the resistance of adjustable resistance is 1/n times as large as the allowable threshold, the second voltage can be n/(n+1) times as large as the first voltage (n is an integer).

Although the adjustable resistance can be 5MΩ or less, the method can be capable of outputting the comparison result when the sensed resistance between the electrodes is equal to or less than 5MΩ.

It is to be understood that both the foregoing general description and the following detailed description are exemplary and explanatory and are intended to provide further explanation of the claimed invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
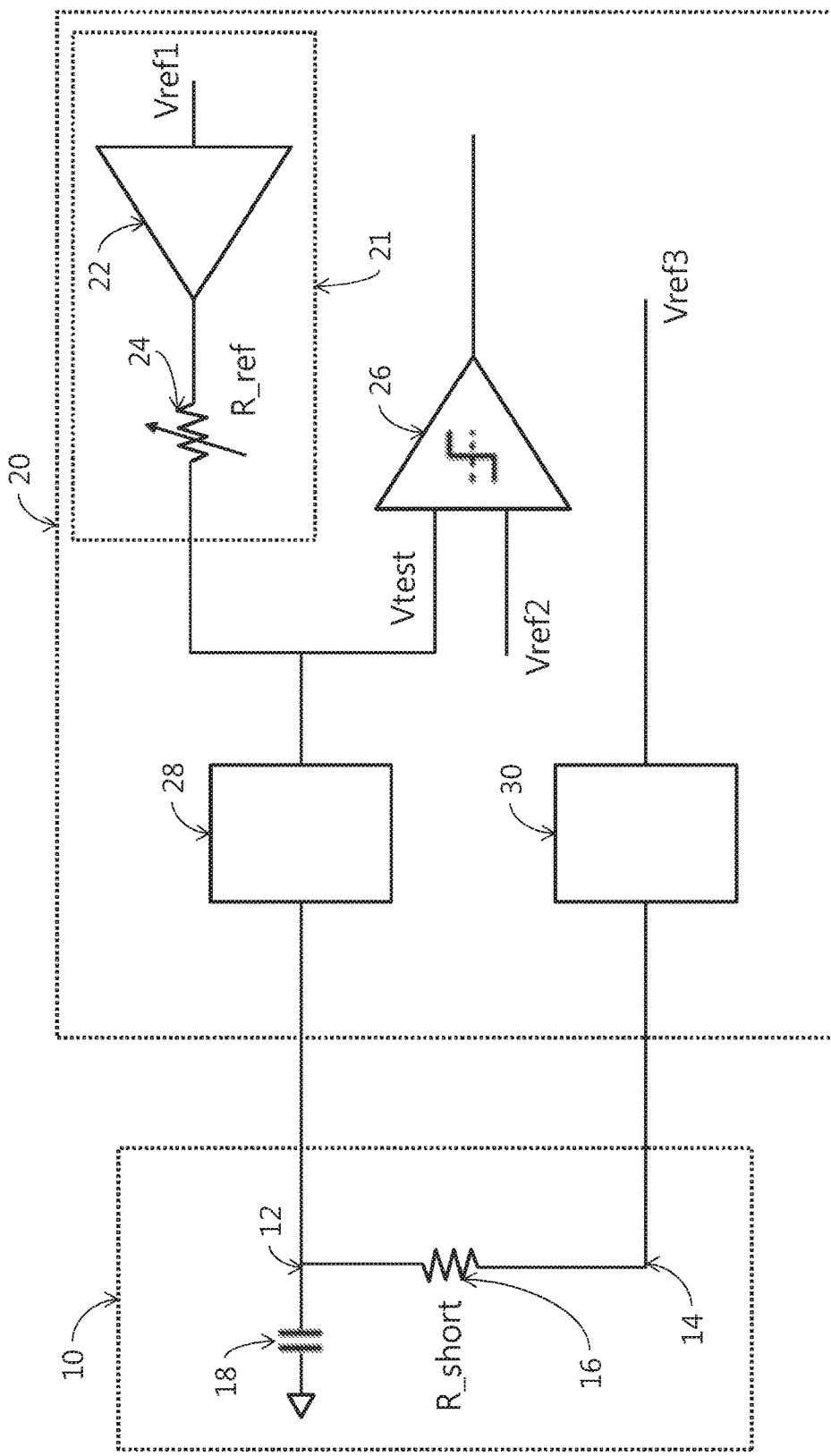
FIG. 1 shows a first touch sensor test apparatus.

Reference will now be made in detail to the preferred embodiments of the disclosure, examples of which are illustrated in the accompanying drawings. In the drawings, the same elements are denoted by the same reference numerals, and a repeated explanation thereof will not be given. The suffixes "module" and "unit" of elements herein are used for convenience of description and thus can be used interchangeably and do not have any distinguishable meanings or functions.

The terms "a" or "an", as used herein, are defined as one or more than one. The term "another", as used herein, is defined as at least a second or more. The terms "including" and/or "having" as used herein, are defined as comprising (i.e. open transition). The term "coupled" or "operatively coupled" as used herein, is defined as connected, although not necessarily directly, and not necessarily mechanically.

In the description of the disclosure, certain detailed explanations of related art are omitted when it is deemed that they may unnecessarily obscure the essence of the disclosure. The features of the disclosure will be more clearly understood from the accompanying drawings and should not be limited by the accompanying drawings. It is to be appreciated that all changes, equivalents, and substitutes that do not depart from the spirit and technical scope of the disclosure are encompassed in the disclosure.

FIG. 1 shows a first touch sensor test apparatus.

As shown, the first touch sensor test apparatus 20 can include a test power supplier 21 comprising an allowable threshold about resistance between electrodes 12, 14 of touch sensor 10, and a comparison unit 26 configured to compare sensed resistance R_short between the electrodes 12, 14 with the allowable threshold to output a comparison result.

Since an insulator (or insulation layer) is placed between the two electrodes 12, 14 of touch sensor 10, resistance between the two electrodes 12, 14 is infinite theoretically. However, because of some reasons, e.g., incomplete etching occurring during a manufacturing process, the two electrodes 12, 14 of touch sensor 10 can be coupled to each other electrically. As long as the resistance R_short formed between the two electrodes 12, 14 of touch sensor 10 becomes larger, the two electrodes 12, 14 can be separate electrically. As the resistance R_short becomes smaller, it can be determined that the two electrodes 12, 14 are short electrically. Hereinafter, to help understand, the resistance R_short is a resistance of first resistor 16 located between the two electrodes 12, 14. Further, as the touch sensor 10 has a smaller size, parasitic capacitance can be occurred for manufacturing reasons. To help understand, the capacitance at the two electrodes 12, 14 of touch sensor 10 is a capacitance of first capacitor 18.

The test power supplier 21 can include an adjustable resistance 24 having a resistance R_ref changed in response to the allowable threshold, and a buffer 22 for buffering a power supplied into the adjustable resistance 24. The resistance R_ref of adjustable resistance 24 can be equal to or n times larger than the allowable threshold, where n is an integer.

The allowable threshold is a kind of minimum value which determines whether the touch sensor 10 normally operates under operational circumstances or according to performance requirements. As above mentioned, though the resistance R_short formed between the two electrodes 12, 14 of touch sensor 10 should be infinite properly, the resistance R_short can actually be in infinite variety. If the resistance R_short is 0Ω, the two electrodes 12, 14 of touch sensor 10 are electrically short and the touch sensor 10 cannot operate properly. However, if the resistance R_short is within a range of larger than 0Ω and less than infinite, whether the touch sensor 10 is defective can be different according to a performance requirement for the touch sensor 10. Herein, the performance requirement can be different according to what purpose the touch sensor 10 is used for, what kind of system or device the touch sensor 10 is included, or the like. By the way of example but not limitation, the allowable threshold can be 50MΩ, i.e., the touch sensor is defective when the resistance R_short is less than 50MΩ. Otherwise, the allowable threshold can be 3MΩ. The first touch sensor test apparatus 20 can check whether the resistance R_short in the touch sensor 10 is larger than or equal to the allowable threshold, even if the allowable threshold is relatively small such as 10MΩ, 3MΩ, 1MΩ, and etc.

The first touch sensor test apparatus 20 can further include switching devices 28, 30 configured to selectively couple the touch sensor 10 to the test power supplier 21 and the comparison unit 26. The switching devices 28, 30 can include a multiplexer, and the like.

The comparison unit 26 announces that the touch sensor 10 is defective when the resistance R_short between the electrodes 12, 14 is less than the allowable threshold, while informing that the touch sensor 10 is faultless when the resistance R_short between the electrodes 12, 14 is equal to or larger than the allowable threshold.

When a first reference voltage Vref1 supplied into the buffer 22 is larger than a third reference voltage Vref3 coupled to the switching device 30, the test voltage Vtest inputted to the comparison unit 26 can be determined as follows.

$$V\text{test}=(V\text{ref1}-V\text{ref3}) \times R\_\text{short}/(R\_\text{ref}+R\_\text{short})$$

As the resistance R_short between the two electrodes 12, 14 of touch sensor 10 is smaller (i.e., the two electrodes are more electrically coupled, or there is high possibility that the two electrodes are short), the test voltage Vtest has a lower level, and the comparison unit can output a logic signal of '0' when the test voltage Vtest has a lower level than the second reference voltage Vref2.

As above described, a resistance R_ref of the adjustable resistance 24 can be the same with the allowable threshold. When the first reference voltage Vref1 is supplied into the adjustable resistance 24, the second reference Vref2 supplied into the comparison unit 26 has a half (½) level of the first reference voltage Vref1.

Further, if the resistance R_ref of adjustable resistance 24 is n times as large as the allowable threshold, the second reference voltage Vref2 supplied into the comparison unit 26 is 1/(n+1) times as large as a first voltage Vref1 supplied into the adjustable resistance 24, where n is an integer.

Further, when the resistance R_ref of adjustable resistance 24 is 1/n times as large as the allowable threshold, the second reference voltage Vref2 supplied into the comparison unit 26 is n/(n+1) times as large as a first voltage Vref1 supplied into the adjustable resistance 24, where n is an integer.

Figure 2:
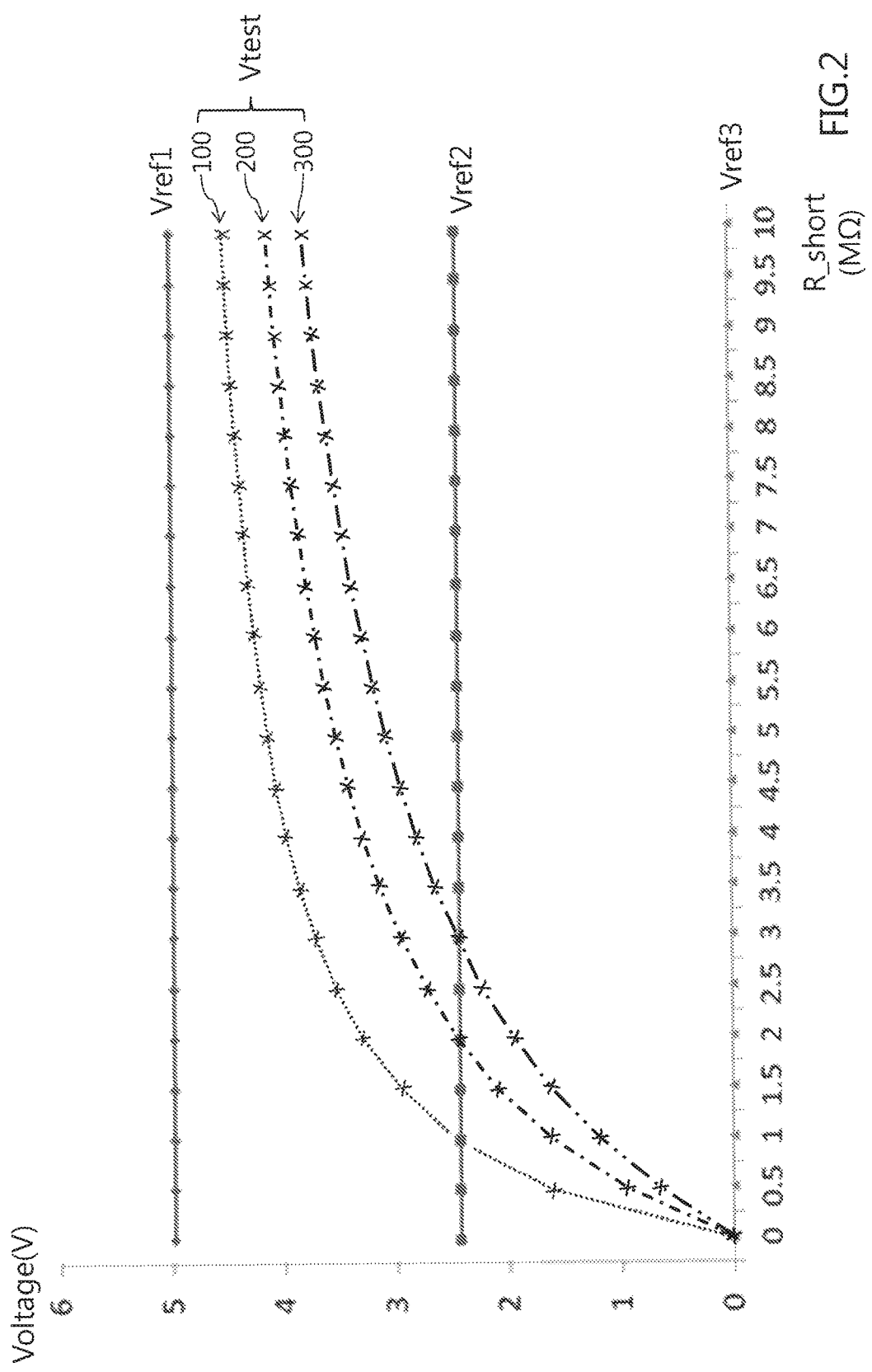
FIG. 2 describes how the first touch sensor test apparatus shown in FIG. 1 operates.

FIG. 2 depicts how the first touch sensor test apparatus shown in FIG. 1 operates.

Referring to FIG. 2, the first reference voltage Vref1 can be 5V while the third reference voltage Vref3 can be 0V. In a case when the allowable threshold is the same with the resistance R_ref of adjustable resistance 24, the second reference voltage Vref2 can be 2.5V, i.e., a half (½) level of the first reference voltage Vref1.

When the resistance R_ref of adjustable resistance 24 is 1MΩ, the test voltage Vtest can have a first distribution 100 over the change of the reference R_short. If the resistance R_ref of adjustable resistance 24 is 2MΩ, the test voltage Vtest can have a second distribution 200 over the change of the reference R_short. Further, when the resistance R_ref of adjustable resistance 24 is 3MΩ, the test voltage Vtest can have a third distribution 300 over the change of the reference R_short. Herein, to help understand, the first, second, third distributions 100, 200, 300 are formed by connecting test results with each other. Actual test data can be obtained separately according to the resistance R_ref of adjustable resistance 24 as well as the reference R_short between the two electrodes 12, 14 of touch sensor 10.

By the way of example but not limitation, referring to FIG. 2, if the resistance R_short between the two electrodes 12, 14 of touch sensor 10 is 0Ω, the two electrodes 12, 14 of touch sensor 10 are electrically short, so the test voltage Vtest is 0V. In this case, since the test voltage is lower than the second reference voltage Vref2, the touch sensor 10 can be considered a defective sensor.

By the way of example but not limitation, it is assumed that the resistance R_short between the two electrodes 12, 14 of touch sensor 10 is 1.5MΩ.

First, when the resistance R_ref of adjustable resistance 24 is 1MΩ, the test voltage Vtest referring to the first distribution 100 is 3V. In this case, the touch sensor 10 can be considered a faultless sensor because the test voltage of 3V is higher than the second reference voltage Vref2 of 2.5V.

If the resistance R_ref of adjustable resistance 24 is 2MΩ, the test voltage Vtest referring to the second distribution 200 is 2V. In this case, the touch sensor 10 can be considered a defective sensor because the test voltage of 2V is lower than the second reference voltage Vref2 of 2.5V.

For another example, when the resistance R_ref of adjustable resistance 24 is 3MΩ (i.e., the allowable threshold is 3MΩ), the test voltage Vtest referring to the third distribution 300 is 1.7(5/3)V. In this case, the touch sensor 10 can be considered a defective sensor because the test voltage of 1.7V is lower than the second reference voltage Vref2 of 2.5V.

Further, it can be assumed that the resistance R_short between the two electrodes 12, 14 of touch sensor 10 is 10MΩ. When the resistance R_ref of adjustable resistance 24 is one of 1 to 3MΩ (i.e., the allowable threshold is one of 1 to 3MΩ), all of the test voltages Vtest are higher than the second reference voltage Vref2. Accordingly, it can be determined that the touch sensor 10 is faultless.

Figure 3:
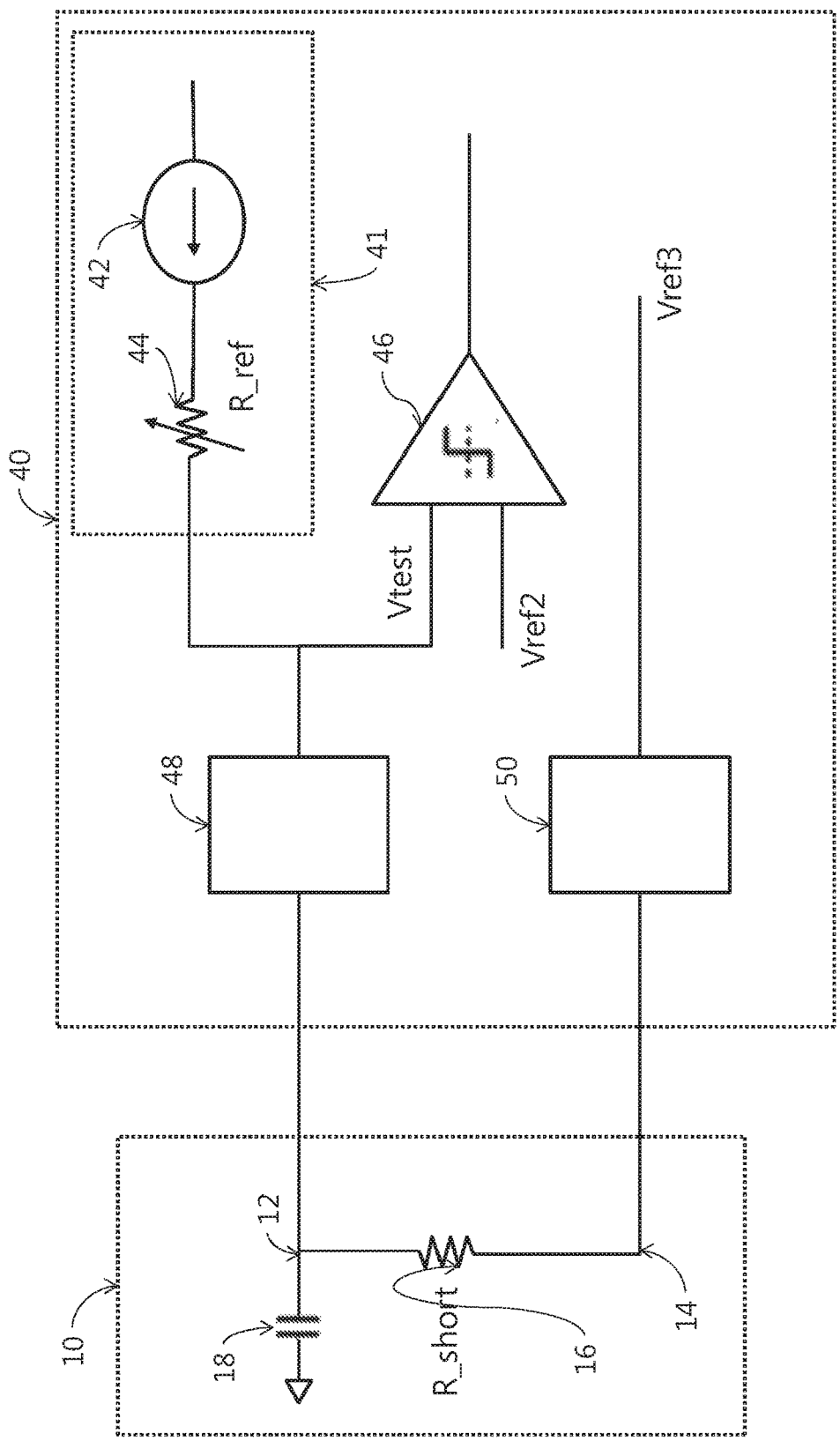
FIG. 3 shows a second touch sensor test apparatus.

FIG. 3 shows a second touch sensor test apparatus.

As shown, the second touch sensor test apparatus 40 can include a test power supplier 41 comprising an allowable threshold about resistance between electrodes 12, 14 of touch sensor 10, and a comparison unit 46 configured to compare sensed resistance R_short between the electrodes 12, 14 with the allowable threshold to output a comparison result.

The test power supplier 41 can include an adjustable resistance 44 having a resistance R_ref changed in response to the allowable threshold, and a current source 42 for buffering a power supplied into the adjustable resistance 44. The resistance R_ref of adjustable resistance 44 can be equal to or n times larger than the allowable threshold, where n is an integer.

Further, the first touch sensor test apparatus 40 can include switching devices 48, 50 configured to selectively couple the touch sensor 10 to the test power supplier 41 and the comparison unit 46. The switching devices 48, 50 can include a multiplexer, and the like.

The comparison unit 46 can inform that the touch sensor 10 is a defective sensor when the resistance R_short between the electrodes 12, 14 is less than the allowable threshold, while informing that the touch sensor 10 is a faultless sensor when the resistance R_short between the electrodes 12, 14 is equal to or larger than the allowable threshold.

Figure 4:
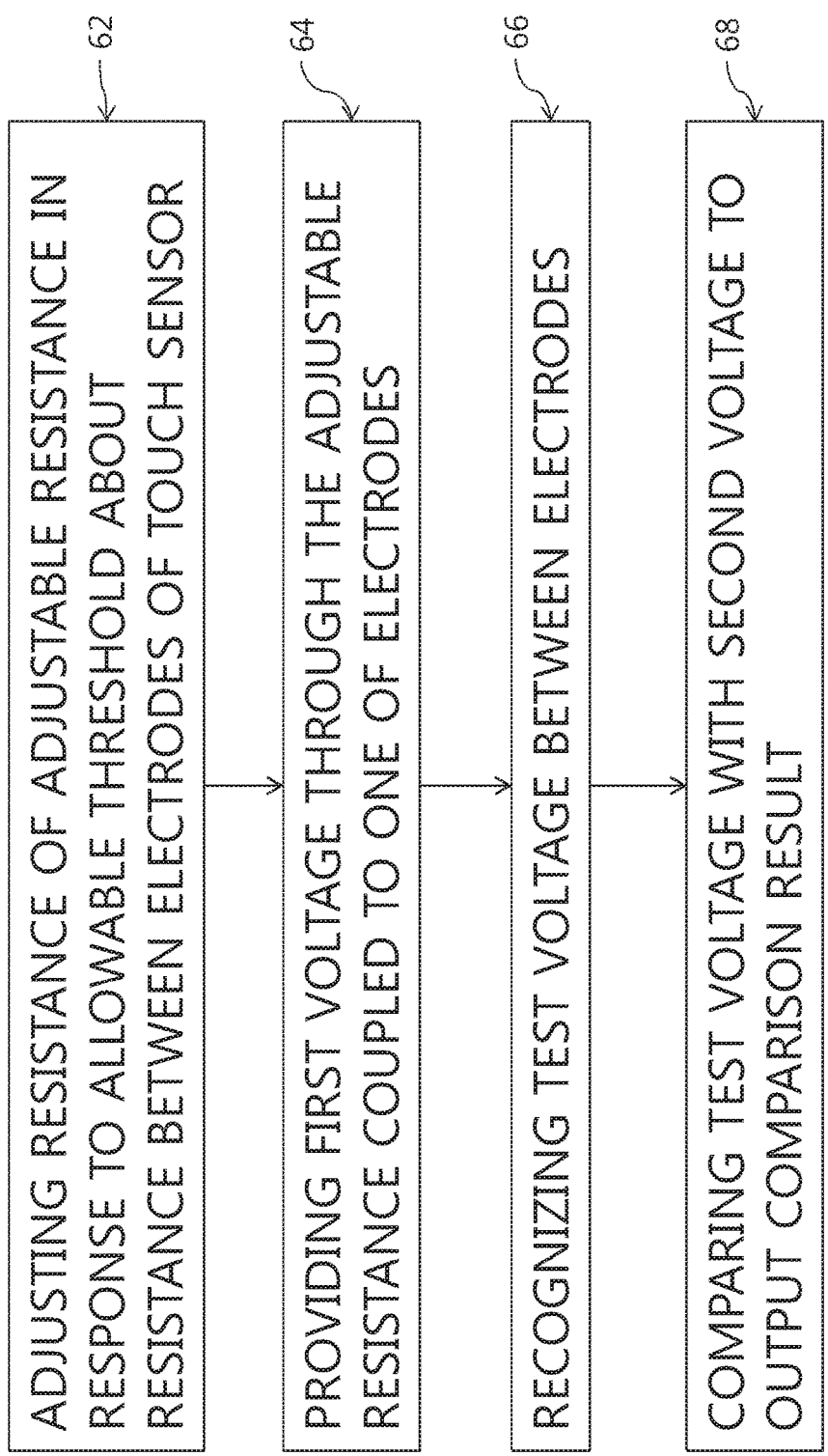
FIG. 4 shows a method for testing a touch sensor.

FIG. 4 shows a method for testing a touch sensor.

Referring to FIGS. 1 and 4, a method for checking a touch sensor can include adjusting resistance R_ref of adjustable resistance 24 in response to an allowable threshold about resistance R_short between two electrodes 12, 14 of touch sensor 10 (step 62), providing a first voltage Vref1 through the adjustable resistance 24 coupled to one of the two electrodes 12, 14 (step 64), recognizing a test voltage Vtest between the two electrodes 12, 14 (step 66), and comparing the test voltage Vtest with a second voltage Vref2 to output a comparison result (step 68). Herein, the test voltage Vtest is determined based on the resistance R_ref of adjustable resistance 24, the resistance R_short between the two electrodes 12, 14 and the first voltage Vref1, while the second voltage Vref2 is corresponding to the resistance R_ref of adjustable resistance 24, the allowable threshold and the first voltage Vref1.

The second voltage Vref2 can be supplied into the comparison unit 26, in response to the first voltage Vref1. When the resistance R_ref of adjustable resistance 24 is n times as large as the allowable threshold, the second voltage Vref2 is $1/(n+1)$ times as large as the first voltage Vref1, where n is an integer.

If the resistance R_ref of adjustable resistance 24 is $1/n$ times as large as the allowable threshold, the second voltage Vref2 is $n/(n+1)$ times as large as the first voltage Vref1, where n is an integer.

In this method, although the adjustable resistance has a sort of small resistance such as $5M\Omega$, $3M\Omega$, $1M\Omega$ and so on, the method can be capable of outputting the comparison result when a sensed resistance between the electrodes 12, 14 is equal to or less than $5M\Omega$.

According to the embodiments, an apparatus or a method can be capable of checking whether a touch sensor is defective, based on sensed resistance between electrodes of touch sensor, which excludes influence of capacitance between the electrodes.

Further, since the disclosure supports an apparatus or a method for detecting defects of a touch sensor in response to a performance requirement of the touch sensor, test accuracy and efficiency can be enhanced, a defect rate corresponding to the performance requirement can be decreased, and a manufacturing yield can be improved, according to the embodiments.

Further, since a test circuit described above can be included in either a control chip or an additional module, restriction or limitation on circuit design for the touch sensor can be limited, according to embodiments.

The aforementioned methods according to the embodiments of the present disclosure may be embodied as a program to be executed in a computer and stored in a computer readable recording medium. Examples of the computer readable recording medium include read-only memory (ROM), random-access memory (RAM), CD-ROMs, magnetic tapes, floppy disks, optical data storage devices, etc.

The computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

Those skilled in the art will appreciate that the present disclosure may be carried out in other specific ways than those set forth herein without departing from the spirit and essential characteristics of the present disclosure.

The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

What is claimed is:

1. An apparatus for testing a touch sensor including a first electrode and a second electrode, the apparatus comprising:
   a test power supplier having an adjustable resistance coupled to the first electrode of the touch sensor, wherein the test power supplier is configured to supply a first reference voltage (Vref1) into the adjustable resistance; and
   a comparison unit configured to compare a test voltage (Vtest) with a second reference voltage and output a comparison result,
   the apparatus configured to detect a voltage at the second electrode (Vref3) and a resistance between the first electrode and the second electrode (R_short)
   wherein the adjustable resistance has a resistance value (R_ref) that is based upon to an allowable threshold about resistance between the first and second electrodes of the touch sensor according to the equation Vtest= (Vref1−Vref3)×R_short/(R_ref+R_short).

2. The apparatus according to claim 1, wherein the comparison unit is configured to determine that the touch sensor is a defective sensor when the test voltage is lower than the second reference voltage.

3. The apparatus according to claim 2 wherein the resistance value of the adjustable resistance is substantially equal to the allowable threshold, and the second reference voltage is one half of the first reference voltage.

4. The apparatus according to claim 2, wherein the test power supplier further comprises a buffer for buffering the first reference voltage, and wherein an output of the buffer is coupled to the adjustable resistance.

5. The apparatus according to claim 2, wherein the test power supplier further comprises a power source for providing an amount of current corresponding to the allowable threshold.

6. The apparatus according to claim 2, wherein the comparison unit configured to determine that the touch sensor is a faultless sensor when the test voltage is higher than the second reference voltage.

7. The apparatus according to claim 2 wherein the resistance value of adjustable resistance is n times as large as the allowable threshold, the second reference voltage is $1/(n+1)$ times as large as the first reference voltage, where n is an integer.

8. The apparatus according to claim 2, wherein the resistance value of adjustable resistance is $1/n$ times as large as the allowable threshold, the second reference voltage is $n/(n+1)$ times as large as the first reference voltage, where n is an integer.

9. The apparatus according to claim 1, further comprising:
a switching device configured to selectively couple the touch sensor to the test power supplier and the comparison unit.

* * * * *